(12) United States Patent
Miyoshi

(10) Patent No.: US 6,559,643 B2
(45) Date of Patent: May 6, 2003

(54) MAGNETIC RESONANCE METHOD AND APPARATUS WHICH MEASURES RESIDUAL MAGNETIZATION FROM TWO OR MORE ORDERLY HEIGHT REDUCE GRADIENT PULSES, OF ALTERNATELY INVERTED POLARITY, APPLIED PRIOR TO THE TRANSMITTING OF RF PULSES

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 59 days.

(21) Appl. No.: 09/945,947

(22) Filed: Sep. 4, 2001

(65) Prior Publication Data

US 2002/0050817 A1 May 2, 2002

(30) Foreign Application Priority Data

Oct. 31, 2000 (JP) ........................ 2000-331798

(51) Int. Cl.⁷ ............................................. G01V 3/00
(52) U.S. Cl. ....................................... 324/309; 324/307
(58) Field of Search ............................ 324/307, 309, 324/318, 319, 320, 300, 306, 303

(56) References Cited

U.S. PATENT DOCUMENTS

| | | | | |
|---|---|---|---|---|
| 4,910,460 A | * | 3/1990 | Sebok | 324/307 |
| 5,070,299 A | * | 12/1991 | Keifer et al. | 324/309 |
| 5,133,357 A | * | 7/1992 | Dumoulin et al. | 600/413 |
| 5,592,085 A | * | 1/1997 | Ehman | 324/309 |
| 5,729,139 A | | 3/1998 | Goto | 324/309 |
| 5,899,858 A | * | 5/1999 | Muthupillai et al. | 600/410 |
| 5,977,770 A | * | 11/1999 | Ehman | 324/318 |
| 6,127,825 A | | 10/2000 | Goto | 324/307 |
| 6,218,834 B1 | | 4/2001 | Goto | 324/307 |
| 6,335,620 B1 | * | 1/2002 | Weissenberger | 324/307 |
| 6,452,387 B1 | * | 9/2002 | Hargreaves et al. | 324/300 |

* cited by examiner

*Primary Examiner*—Edward Lefkowitz
*Assistant Examiner*—Tiffany A. Fetzner
(74) *Attorney, Agent, or Firm*—Moonray Kojima

(57) ABSTRACT

For the purpose of restraining an effect of residual magnetization caused by a previous MR imaging pulse sequence on an MR image, a demagnetizing gradient pulse sequence RS1–RS4 is applied prior to an MR imaging pulse sequence to cancel the residual magnetization caused by the previous MR imaging pulse sequence and reduce the residual magnetization.

18 Claims, 5 Drawing Sheets

MR Imaging Pulse Sequence

MAGNETIC RESONANCE METHOD AND APPARATUS WHICH MEASURES RESIDUAL MAGNETIZATION FROM TWO OR MORE ORDERLY HEIGHT REDUCE GRADIENT PULSES, OF ALTERNATELY INVERTED POLARITY, APPLIED PRIOR TO THE TRANSMITTING OF RF PULSES

BACKGROUND OF THE INVENTION

The present invention relates to an MR imaging method, residual magnetization amount measuring method and MRI (magnetic resonance imaging) apparatus, and more particularly to an MR imaging method capable of restraining residual magnetization caused by a previous pulse sequence from affecting a current pulse sequence, a residual magnetization amount measuring method for verifying a demagnetizing effect, and an MRI apparatus for implementing such methods.

In the publications of Japanese Patent Application Laid Open Nos. H8-322817 and H10-75940, MR imaging methods are disclosed in which a corrective component is appended to a phase encoder gradient or rewind gradient for restraining residual magnetization caused by a phase encoder gradient from affecting an echo next to an echo that corresponds to the phase encoder gradient.

In MR imaging, a pulse sequence involving transmitting an RF pulse, applying a phase encoder gradient and receiving an NMR signal from a subject is repeated with the phase encoding amount varied to thereby collect data for filling the k-space.

The aforementioned conventional techniques restrain the effect of residual magnetization within one pulse sequence, and do not restrain residual magnetization caused by a previous pulse sequence from affecting the current pulse sequence.

SUMMARY OF THE INVENTION

It is therefore an object of the present invention to provide an MR imaging method capable of restraining residual magnetization caused by a previous pulse sequence from affecting the current pulse sequence, a residual magnetization amount measuring method for verifying a demagnetizing effect, and an MRI apparatus for implementing such methods.

In its first aspect, the present invention provides an MR imaging method for transmitting an RF pulse, applying a phase encoder gradient, receiving an NMR signal from a subject and producing an MR image based on said NMR signal, characterized in: prior to transmitting the RF pulse, consecutively applying first through I-th ($\geq 2$) gradient pulses having alternately inverting polarity and pulse heights reduced in order.

In accordance with the MR imaging method of the first aspect, since first through I-th gradient pulses having alternately inverting polarity and pulse heights reduced in order are consecutively applied prior to substantially beginning a pulse sequence for acquiring data, residual magnetization of a previous pulse sequence is demagnetized, and thereafter the pulse sequence for acquiring data is substantially begun. Therefore, residual magnetization caused by the previous pulse sequence can be restrained from affecting the current pulse sequence.

In its second aspect, the present invention provides the MR imaging method of the aforementioned configuration, characterized in that said first gradient pulse has a pulse height such as to saturate residual magnetization.

In accordance with the MR imaging method of the second aspect, since a first gradient pulse having a pulse height such as to saturate residual magnetization is applied, even if residual magnetization remains after applying the I-th gradient pulse, the amount of the residual magnetization is always constant. For example, in a pulse sequence according to a spin echo technique, while a varying amount of residual magnetization causes artifacts on an MR image, an always constant amount of residual magnetization does not generate artifacts on an MR image. On the other hand, in a pulse sequence according to a fast spin echo technique, even a constant amount of residual magnetization causes artifacts on an MR image as it stands because an offset in an odd-numbered echo and an offset in an even-numbered echo are in opposite directions; however, the offset amounts are constant and therefore it is possible to correct data. Thus, residual magnetization caused by the previous pulse sequence can be restrained from affecting the current pulse sequence.

In its third aspect, the present invention provides the MR imaging method of the aforementioned configuration, characterized in that I=4.

If I is increased, residual magnetization can be further reduced but this processing is time consuming. On the other hand, if I is decreased, the processing time can be reduced but the effect of decreasing residual magnetization is also reduced.

Therefore, in accordance with the MR imaging method of the third aspect, I=4. Thus, tradeoff between the effect of decreasing residual magnetization and the processing time can be optimized.

In its fourth aspect, the present invention provides the MR imaging method of the aforementioned configuration, characterized in that the first through I-th gradient pulses have trapezoidal pulse waveforms.

In accordance with the MR imaging method of the fourth aspect, by shaping the pulse waveforms as trapezoids, they can be raised at the maximum slew rate possible with the hardware.

In its fifth aspect, the present invention provides a residual magnetization amount measuring method characterized in: consecutively applying first through I-th ($\geq 2$) gradient pulses having alternately inverting polarity and pulse heights reduced in order; applying a 90° RF pulse; applying a 180° RF pulse; observing a first echo while applying a read gradient; transmitting a 180° RF pulse; observing a second echo while applying a read gradient; and measuring a residual magnetization amount from offsets of echo peaks of said first and second echoes.

The effect of residual magnetization after applying the gradient pulses appears as an offset of an echo peak from an echo center. The offset of an echo peak from an echo center is, however, difficult to measure because the echo center is difficult to identify when a single echo is taken.

Therefore, in accordance with the residual magnetization amount measuring method of the fifth aspect, an echo peak of a first echo and that of a second echo are compared. Since an offset of the echo peak from the echo center of the first echo and an offset of the echo peak from the echo center of the second echo are in opposite directions, half of the offsets of the echo peaks of the first and second echoes gives the offset of an echo peak from an echo center. Hence, the residual magnetization amount can be determined from the offset. That is, the effect of applying the gradient pulses can be evaluated.

In its sixth aspect, the present invention provides the MR imaging method of the aforementioned configuration, characterized in adjusting at least one of the pulse height and the pulse width of the second through I-th gradient pulses based on the residual magnetization amount measured by the residual magnetization amount measuring method of the aforementioned configuration.

In accordance with the MR imaging method of the sixth aspect, the pulse width and the pulse height of the gradient pulses can be optimized.

In its seventh aspect, the present invention provides the MR imaging method of the aforementioned configuration, characterized in that the pulse height of an i-th gradient pulse is half the pulse height of an (i−1)-th gradient pulse.

In accordance with the MR imaging method of the seventh aspect, since the pulse heights of the gradient pulses are halved in order, the processing can be simplified.

In its eighth aspect, the present invention provides the MR imaging method of the aforementioned configuration, characterized in that the pulse widths of the first through I-th gradient pulses are substantially the same.

In accordance with the MR imaging method of the eighth aspect, since the pulse width is not varied among the gradient pulses, the processing can be simplified.

In its ninth aspect, the present invention provides the MR imaging method of the aforementioned configuration, characterized in applying the first through I-th gradient pulses to a gradient axis to which a phase encoder gradient is applied.

It is the residual magnetization caused by a phase encoder gradient that especially becomes an issue in MR imaging.

Therefore, in accordance with the MR imaging method of the ninth aspect, the effect of residual magnetization caused by a phase encoder gradient is particularly reduced by applying the aforementioned gradient pulses to a gradient axis to which the phase encoder gradient is applied. In some pulse sequences having a plurality of gradient axes to which the phase encoder gradient is applied, the above gradient pulses are applied to those gradient axes.

In its tenth aspect, the present invention provides an MRI apparatus comprising RF pulse transmitting means, gradient pulse applying means and NMR signal receiving means, said apparatus controlling said means to transmit an RF pulse, apply a phase encoder gradient, receive an NMR signal from a subject and produce an MR image based on said NMR signal, characterized in comprising: residual magnetization demagnetizing means for, prior to transmitting the RF pulse, consecutively applying first through I-th ($\geq 2$) gradient pulses having alternately inverting polarity and pulse heights reduced in order.

In accordance with the MRI apparatus of the tenth aspect, the MR imaging method of the first aspect can be suitably implemented.

In its eleventh aspect, the present invention provides the MRI apparatus of the aforementioned configuration, characterized in that said first gradient pulse has a pulse height such as to saturate residual magnetization.

In accordance with the MRI apparatus of the eleventh aspect, the MR imaging method of the second aspect can be suitably implemented.

In its twelfth aspect, the present invention provides the MRI apparatus of the aforementioned configuration, characterized in that I=4.

In accordance with the MRI apparatus of the twelfth aspect, the MR imaging method of the third aspect can be suitably implemented.

In its thirteenth aspect, the present invention provides the MRI apparatus of the aforementioned configuration, characterized in that the first through I-th gradient pulses have trapezoidal pulse waveforms.

In accordance with the MRI apparatus of the thirteenth aspect, the MR imaging method of the fourth aspect can be suitably implemented.

In its fourteenth aspect, the present invention provides an MRI apparatus comprising RF pulse transmitting means, gradient pulse applying means and NMR signal receiving means, said apparatus controlling said means to transmit an RF pulse, apply a phase encoder gradient, receive an NMR signal from a subject and produce an MR image based on said NMR signal, characterized in comprising: residual magnetization amount measuring means for consecutively applying first through I-th ($\geq 2$) gradient pulses having alternately inverting polarity and pulse heights reduced in order; applying a 90° RF pulse; applying a 180° RF pulse; observing a first echo while applying a read gradient; transmitting a 180° RF pulse; observing a second echo while applying a read gradient; and measuring a residual magnetization amount from offsets of echo peaks of said first and second echoes.

In accordance with the MRI apparatus of the fourteenth aspect, the MR imaging method of the fifth aspect can be suitably implemented.

In its fifteenth aspect, the present invention provides the MRI apparatus of the aforementioned configuration, characterized in adjusting at least one of the pulse height and the pulse width of the second through I-th gradient pulses based on the residual magnetization amount measured by the residual magnetization amount measuring means of the aforementioned configuration.

In accordance with the MRI apparatus of the fifteenth aspect, the MR imaging method of the sixth aspect can be suitably implemented.

In its sixteenth aspect, the present invention provides the MRI apparatus of the aforementioned configuration, characterized in that the pulse height of an i-th gradient pulse is half the pulse height of an (i−1)-th gradient pulse.

In accordance with the MRI apparatus of the sixteenth aspect, the MR imaging method of the seventh aspect can be suitably implemented.

In its seventeenth aspect, the present invention provides the MRI apparatus of the aforementioned configuration, characterized in that the pulse widths of the first through I-th gradient pulses are substantially the same.

In accordance with the MRI apparatus of the seventeenth aspect, the MR imaging method of the eighth aspect can be suitably implemented.

In its eighteenth aspect, the present invention provides the MRI apparatus of the aforementioned configuration, characterized in applying the first through I-th gradient pulses to a gradient axis to which a phase encoder gradient is applied.

In accordance with the MRI apparatus of the eighteenth aspect, the MR imaging method of the ninth aspect can be suitably implemented.

According to the MR imaging method and MRI apparatus of the present invention, a demagnetizing gradient pulse sequence is applied prior to an MR imaging pulse sequence to cancel residual magnetization caused by a previous MR imaging pulse sequence and reduce the residual magnetization. Thus, the residual magnetization caused by the previous MR imaging pulse sequence can be restrained from affecting an MR image, and the image quality of MR images can be improved.

Moreover, according to the residual magnetization amount measuring method and MRI apparatus of the present invention, the residual magnetization amount caused by the demagnetizing gradient pulse sequence can be measured. Thus, the demagnetizing effect of the demagnetizing gradient pulse sequence can be evaluated.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to embodiments shown in the accompanying drawings. It should be noted that the present invention is not limited to these embodiments.

Figure 1:
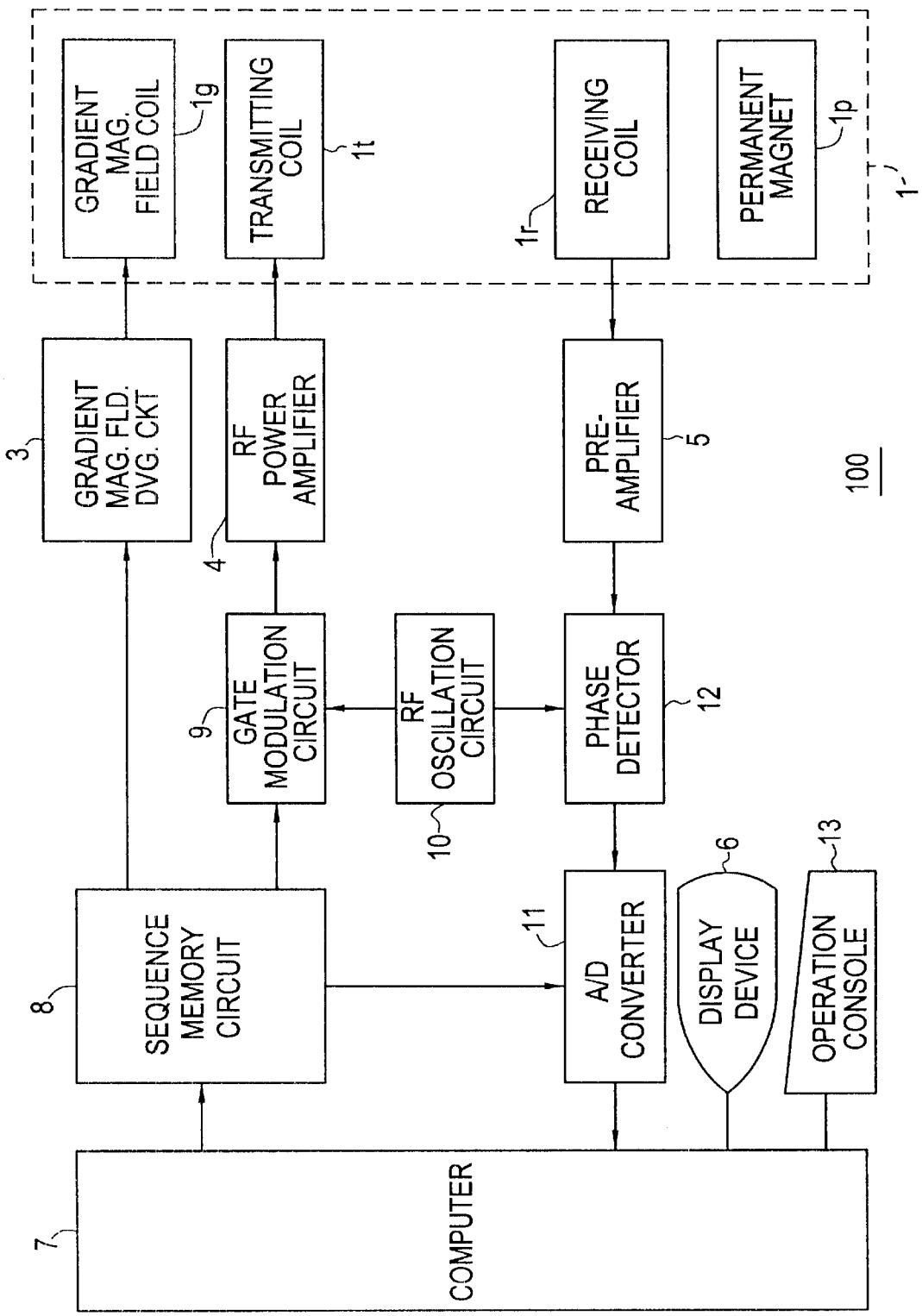
FIG. 1 is a block diagram showing an MRI apparatus in accordance with one embodiment of the present invention.

FIG. 1 is a block diagram of an MRI apparatus in accordance with one embodiment of the present invention.

In the MRI apparatus 100, a magnet assembly 1 has an empty portion (bore) therein for inserting a subject, and surrounding the empty portion are disposed a permanent magnet 1p for applying a constant main magnetic field to the subject; a gradient magnetic field coil 1g for generating gradient magnetic fields along X-, Y- and Z-axes; a transmitting coil 1t for supplying an RF pulse to excite spins of atomic nuclei within the subject; and a receiving coil 1r for detecting an NMR signal from the subject. The gradient magnetic field coil 1g, transmitting coil 1t and receiving coil 1r are connected to a gradient magnetic field driving circuit 3, an RF power amplifier 4 and a preamplifier 5, respectively.

It should be noted that a superconductive magnet may be employed instead of the permanent magnet 1p.

A sequence memory circuit 8 operates the gradient magnetic field driving circuit 3 based on a stored pulse sequence in response to instructions from a computer 7 to thereby generate the gradient magnetic fields from the gradient magnetic field coil 1g in the magnet assembly 1. The sequence memory circuit 8 also operates a gate modulation circuit 9 to modulate a carrier output signal from an RF oscillation circuit 10 into a pulsed signal having a predefined timing and envelope shape. The pulsed signal is applied to the RF power amplifier 4 as an RF pulse, power-amplified in the RF power amplifier 4, and applied to the transmitting coil 1t in the magnet assembly 1 to selectively excite a desired imaging plane.

The preamplifier 5 amplifies an NMR signal from the subject detected at the receiving coil 1r in the magnet assembly 1, and inputs the signal to a phase detector 12. The phase detector 12 phase-detects the NMR signal from the preamplifier 5 with reference to the carrier output signal from the RF oscillation circuit 10, and supplies the phase-detected signal to an A/D converter 11. The A/D converter 11 converts the phase-detected analog signal into digital data, and inputs it to the computer 7.

The computer 7 reads the digital data from the A/D converter 11, and performs an image reconstruction operation to produce an MR image of the imaging plane. The computer 7 is also responsible for overall control such as receiving information input from an operating console 13.

A display device 6 displays the MR image.

Figure 2:
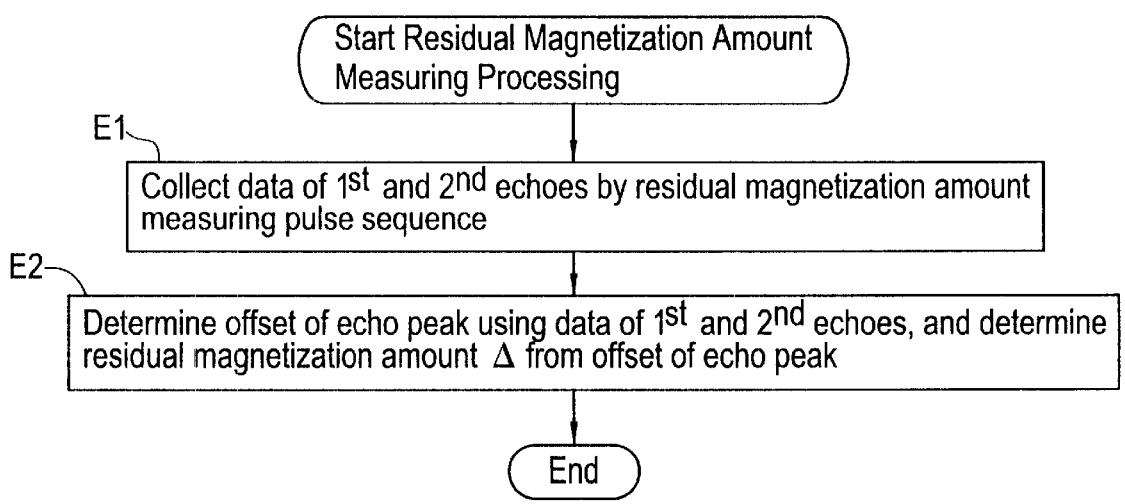
FIG. 2 is a flow chart showing residual magnetization amount measuring processing in accordance with the present invention.

FIG. 2 is a flow chart of residual magnetization amount measuring processing in accordance with the present invention.

Figure 3:
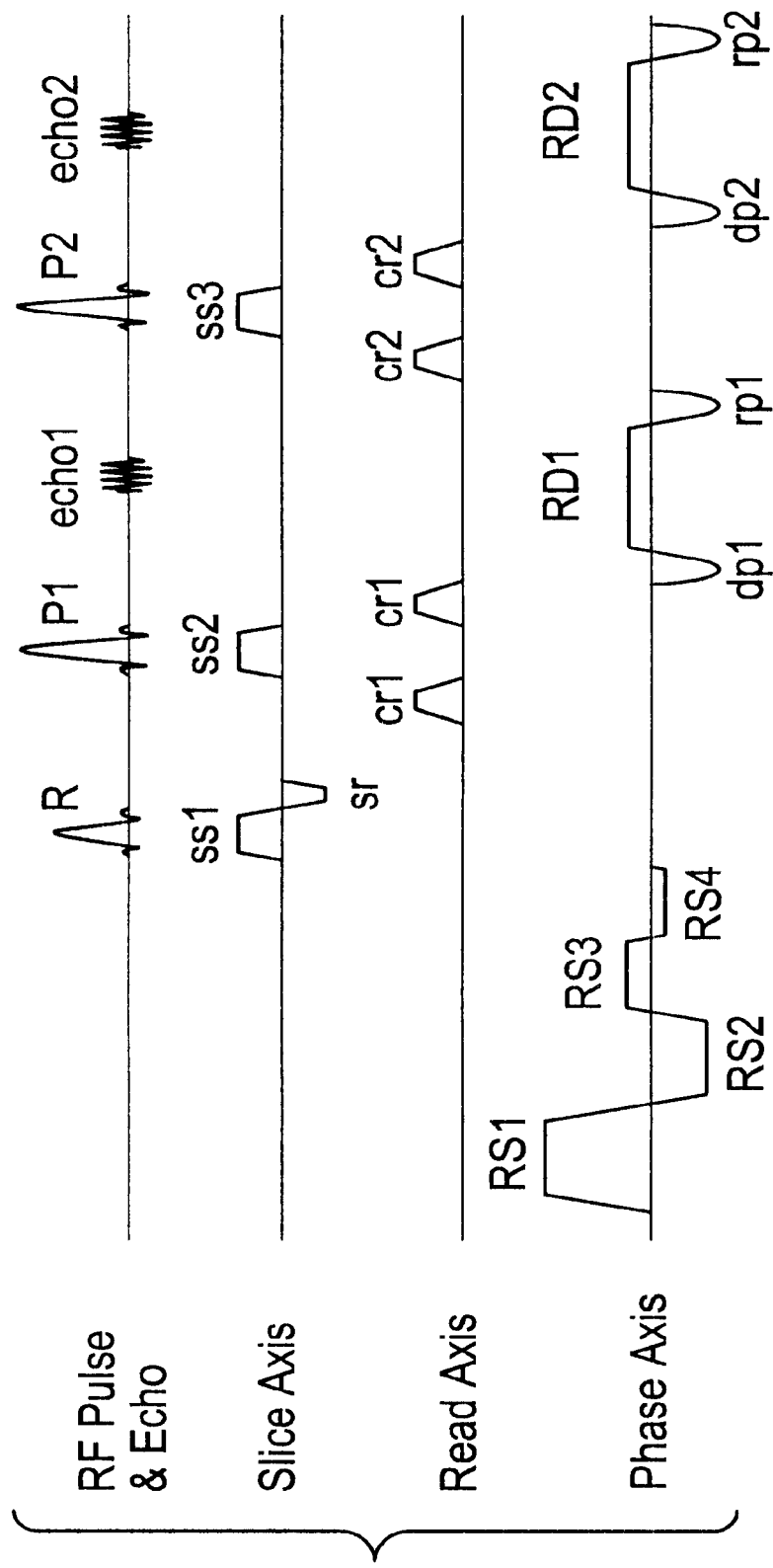
FIG. 3 is an explanatory diagram illustrating a residual magnetization measuring pulse sequence in accordance with the present invention.

In Step E1, data of first and second echoes echo1 and echo2 are collected by a residual magnetization measuring pulse sequence shown in FIG. 3.

In the residual magnetization measuring pulse sequence of FIG. 3, first through fourth gradient pulses RS1–RS4 are consecutively applied to the phase axis. The first through fourth gradient pulses RS1–RS4 have trapezoidal waveforms, alternately inverting polarity and pulse heights halved in order. The pulse height of the first gradient pulse RS1 is such that it saturates the residual magnetization. Moreover, the pulse widths of the first through fourth gradient pulses RS1–RS4 are substantially the same.

Next, an excitation pulse R is transmitted and a slice gradient ss1 is applied to the slice axis. Next, a first inversion pulse P1 is transmitted and a slice gradient ss2 is applied to the slice axis, and further first crusher gradients cr1 are applied to the read axis before and after the first inversion pulse P1. Next, a dephaser gradient dp1 is applied to the phase axis, and an NMR signal of the first echo echo1 is then received while applying a read gradient RD1 to the phase axis, whereafter a rephaser gradient rp1 equal to the dephaser gradient dp1 is applied to the phase axis.

Next, a second inversion pulse P2 is transmitted and a slice gradient ss3 is applied to the slice axis, and further second crusher gradients cr2 are applied to the read axis before and after the second inversion pulse P2. Next, a dephaser gradient dp2 is applied to the phase axis, and an NMR signal of the second echo echo2 is then received while applying a read gradient RD2 to the phase axis, whereafter a rephaser gradient rp2 equal to the dephaser gradient dp2 is applied to the phase axis.

Although the crusher gradients cr1 and cr2 are applied in order to eliminate a stimulated echo and FID (free induction decay) signal, which disturb the measurement of phase error, they may be omitted.

Returning to FIG. 2, in Step E2, an offset of an echo peak is determined from the data of the first and second echoes echo1 and echo2, and a residual magnetization amount Δ is determined from the offset of an echo peak.

The residual magnetization amount Δ measured by the above process represents the magnitude of residual magnetization caused by the first through fourth gradient pulses RS1–RS4.

Then, an appropriate allowed value is defined, and if the residual magnetization amount Δ is greater than the allowed value, the residual magnetization amount Δ is repeatedly measured after modifying the pulse heights of the second through fourth gradient pulses RS2–RS4. When the residual magnetization amount Δ has become less than the allowed value, the first through fourth gradient pulses RS1–RS4 at that time are determined as a demagnetizing gradient pulse sequence.

From the viewpoint of reducing processing time, it is more favorable that the pulse width be small. However, since a too small pulse width leads to an insufficient demagnetizing effect, the pulse width is preferably optimized in a way similar to the above-described process.

Figure 4:
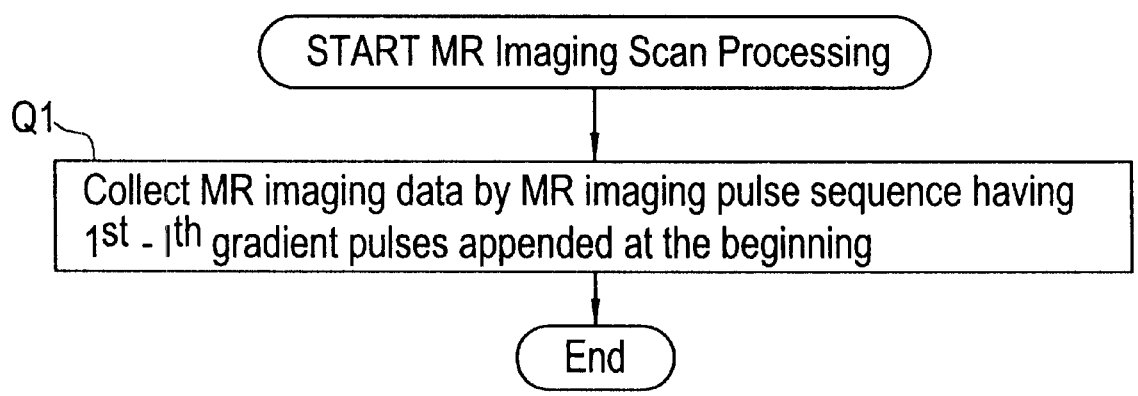
FIG. 4 is a flow chart showing MR imaging scan processing in accordance with one embodiment of the present invention.

FIG. 4 is a flow chart of MR imaging scan processing.

In Step Q1, the demagnetizing gradient pulse sequence of the first through fourth gradient pulses RS1–RS4 determined as above are first applied, and subsequently MR imaging data are collected by an MR imaging pulse sequence that executes an ordinary MR imaging pulse sequence.

The process is then terminated.

Figure 5:
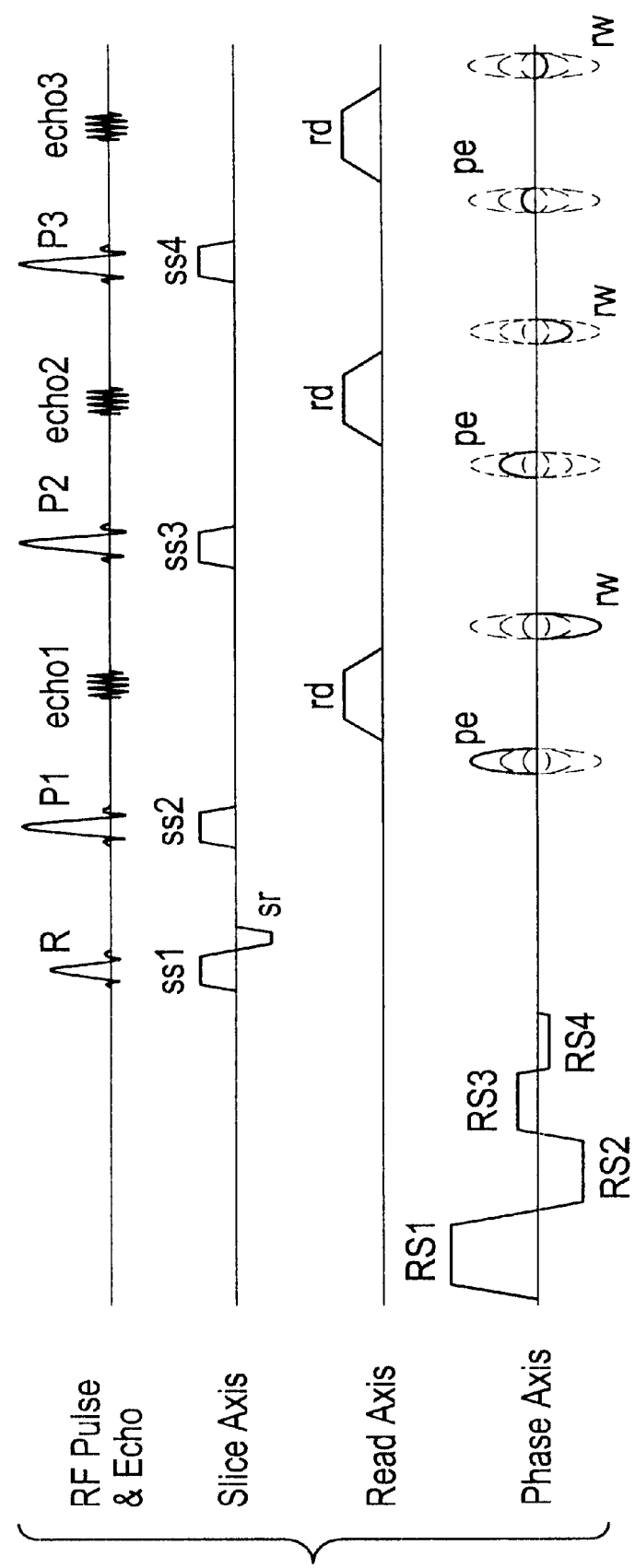
FIG. 5 is an explanatory diagram showing an example of an MR imaging pulse sequence in accordance with the present invention.

FIG. 5 exemplarily shows an MR imaging pulse sequence in which the present invention is applied to the fast spin echo technique.

In the MR imaging pulse sequence, the first through fourth gradient pulses RS1–RS4 are consecutively applied to the phase axis.

Next, an ordinary MR imaging pulse sequence according to the fast spin echo technique is executed. Specifically, an excitation pulse R and a slice gradient ss1 are applied. Next, a first inversion pulse P1 and a slice gradient ss2 are applied. Next, a phase encoder gradient pe is applied to the phase axis. Next, an NMR signal of a first echo echo1 is received while applying a read gradient rd to the phase axis. Next, a rewinder gradient rw is applied to the phase axis. Subsequently, a second inversion pulse P2 and a slice gradient ss3 are applied. Next, a phase encoder gradient pe is applied to the phase axis. Next, an NMR signal of a second echo echo2 is received while applying a read gradient rd to the phase axis. Next, a rewinder gradient rw is applied to the phase axis. Thereafter, NMR signals are received in a similar way with the phase encoding amount varied. This MR imaging pulse sequence is repeated to collect data filling the k-space.

According to the MRI apparatus 100, since a demagnetizing gradient pulse sequence of the first through fourth gradient pulses RS1–RS4 are consecutively applied at the beginning of an MR imaging pulse sequence, residual magnetization due to a previous MR imaging pulse sequence can be removed out. Thereafter, an ordinary MR imaging pulse sequence is executed, and therefore data can be collected without being affected by the residual magnetization of the previous MR imaging pulse sequence, thereby improving the image quality of an MR image.

Although I=4 in the preceding description, it is possible that I≧5. Alternatively, I=2 or I=3 are possible.

The present invention is not limited to an MR imaging pulse sequence according to the fast spin echo technique but may be applied to any MR imaging pulse sequence.

Many widely different embodiments of the invention may be configured without departing from the spirit and the scope of the present invention. It should be understood that the present invention is not limited to the specific embodiments described in the specification, except as defined in the appended claims.

What is claimed is:

1. An MR imaging method for transmitting an RF pulse, applying a phase encoder gradient, receiving an NMR signal from a subject and producing an MR image based on said NMR signal, further comprising the step of: prior to transmitting the RF pulse, consecutively applying first through I-th (≧2) gradient pulses having alternately inverting polarity and pulse heights reduced in order.

2. The MR imaging method of claim 1, wherein said first gradient pulse has a pulse height such as to saturate residual magnetization.

3. The MR imaging method of claim 1, wherein I=4.

4. The MR imaging method of claim 1, wherein the first through I-th gradient pulses have trapezoidal pulse waveforms.

5. A residual magnetization amount measuring method comprising the steps of:
   prior to transmitting RF pulses consecutively applying first through I-th (≧2) gradient pulses having alternately inverting polarity and pulse heights reduced in order;
   applying a 90° RF pulse;
   applying a 180° RF pulse;
   observing a first echo while applying a read gradient;
   transmitting a 180° RF pulse;
   observing a second echo while applying a read gradient; and
   measuring a residual magnetization amount from offsets of echo peaks of said first and second echoes.

6. The MR imaging method of claim 5, further comprising the step of: adjusting at least either the pulse height or the pulse width of the second through I-th gradient pulses based on the residual magnetization amount measured.

7. The MR imaging method of claim 1, wherein the pulse height of an i-th gradient pulse is half the pulse height of an (i–1)-th gradient pulse.

8. The MR imaging method of claim 7, wherein the pulse widths of the first through I-th gradient pulses are substantially the same.

9. The MR imaging method of claim 7, further comprising the step of: applying the first through I-th gradient pulses to a gradient axis to which a phase encoder gradient is applied.

10. An MRI apparatus comprising an RF pulse transmitting device, a gradient pulse applying device and an NMR signal receiving device, said apparatus controlling said device to transmit an RF pulse, apply a phase encoder gradient, receive an NMR signal from a subject and produce an MR image based on said NMR signal, comprising: a residual magnetization demagnetizing device which, prior to transmitting the RF pulse, consecutively applies first through I-th (≧2) gradient pulses having alternately inverting polarity and pulse heights reduced in order.

11. The MRI apparatus of claim 10, wherein said first gradient pulse has a pulse height such as to saturate residual magnetization.

12. The MRI apparatus of claim 10, wherein that I=4.

13. The MRI apparatus of claim 10, wherein the first through I-th gradient pulses have trapezoidal pulse waveforms.

14. An MRI apparatus comprising RF pulse transmitting device, gradient pulse applying device and NMR signal receiving device, said apparatus controlling said device to transmit an RF pulse, apply a phase encoder gradient, receive an NMR signal from a subject and produce an MR image based on said NMR signal, further comprising:
   a residual magnetization amount measuring device which prior to transmitting RF pulses consecutively applies first through I-th (≧2) gradient pulses having alternately inverting polarity and pulse heights reduced in order, and the step of
   applying a 90° RF pulse;
   applying a 180° RF pulse;
   observing a first echo while applying a read gradient;
   transmitting a 180° RF pulse;
   observing a second echo while applying a read gradient; and
   measuring a residual magnetization amount from offsets of echo peaks of said first and second echoes.

15. The MRI apparatus of claims 14, comprising the step of adjusting at least one of either the pulse height of the pulse width of the second through i-th gradient pulses based on the residual magnetization amount measured by the residual magnetization amount measuring device.

16. The MRI apparatus of claim 14, wherein the pulse height of an i-th gradient pulse is half the pulse height of an (i−1)-th gradient pulse.

17. The MRI apparatus of claim 16, wherein the pulse widths of the first through I-th gradient pulses are substantially the same.

18. The MRI apparatus of claim 16, comprising the step of applying the first through I-th gradient pulses to a gradient axis to which a phase encoder gradient is applied.

* * * * *